US012368102B1

(12) United States Patent
Banerjee et al.

(10) Patent No.: US 12,368,102 B1
(45) Date of Patent: Jul. 22, 2025

(54) TECHNIQUES, METHODS, AND STRUCTURES FOR RAPID AND EFFICIENT INTERCALATION-DOPING OF LARGE-AREA MULTI-LAYERED GRAPHENE SHEETS FOR TRANSPARENT CONDUCTOR APPLICATIONS, INCLUDING SOLAR CELLS AND DISPLAYS

(71) Applicant: Destination 2D Inc., Milpitas, CA (US)

(72) Inventors: Kaustav Banerjee, Goleta, CA (US); Brian Cronquist, Klamath Falls, OR (US)

(73) Assignee: Destination 2D Inc., San Jose, CA (US)

( * ) Notice: Subject to any disclaimer, the term of this patent is extended or adjusted under 35 U.S.C. 154(b) by 0 days.

(21) Appl. No.: 18/744,533

(22) Filed: Jun. 14, 2024

Related U.S. Application Data

(60) Provisional application No. 63/618,862, filed on Jan. 8, 2024.

(51) Int. Cl.
  *H01L 23/532* (2006.01)
  *C01B 32/194* (2017.01)
(52) U.S. Cl.
  CPC ...... *H01L 23/53276* (2013.01); *C01B 32/194* (2017.08); *H01L 23/53295* (2013.01);
  (Continued)
(58) Field of Classification Search
  CPC ......... H01L 23/53276; H01L 23/53295; C01B 32/194; C01B 2204/22; C01P 2002/08; C01P 2004/20; C01P 2006/40
  (Continued)

(56) References Cited

U.S. PATENT DOCUMENTS

| 4,728,589 A | 3/1988 | MacDiarmid et al. |
| 8,367,035 B2 * | 2/2013 | Rogers .................. B82Y 40/00 977/932 |

(Continued)

FOREIGN PATENT DOCUMENTS

| WO | 2022140026 A2 | 6/2022 |
| WO | 2024158578 A1 | 8/2024 |
| WO | 2024226197 A1 | 10/2024 |

OTHER PUBLICATIONS

Agashiwala et al., "Demonstration of CMOS-Compatible Multi-Level Graphene Interconnects With Metal Vias", in IEEE Transactions on Electron Devices, vol. 68, No. 4, Apr. 2021, pp. 2083-2091, DOI: 10.1109/TED.2021.3061637.

(Continued)

*Primary Examiner* — Tu-Tu V Ho
(74) *Attorney, Agent, or Firm* — WOMBLE BOND DICKINSON (US) LLP

(57) ABSTRACT

A transparent or semi-transparent conducting thin film structure or pattern which facilitates the insertion of dopant atoms, ions, or molecules into layered 2D materials, the film structure including: a planar sheet of layered 2D material, the layered 2D material having at least one layer disposed in a respective plane, an electrically isolative material, where the electrically isolative material is disposed below the layered 2D material, where the layered 2D material has at least one layer, where the layered 2D material is divided into islands of the 2D material, where separation of the islands of 2D material with respect to each other is greater than 0.5 nm and less than 1 meter, and where the islands of 2D material are intercalation doped with at least one dopant, and where the at least one dopant includes intercalation doping agents.

20 Claims, 2 Drawing Sheets

(52) U.S. Cl.
CPC ...... *C01B 2204/22* (2013.01); *C01P 2002/08* (2013.01); *C01P 2004/20* (2013.01); *C01P 2006/40* (2013.01)

(58) Field of Classification Search
USPC ......................................................... 257/734
See application file for complete search history.

(56) References Cited

U.S. PATENT DOCUMENTS

| | | | |
|---|---|---|---|
| 11,760,633 B2* | 9/2023 | Opoku | C01B 32/15 423/445 R |
| 11,976,369 B2 | 5/2024 | Banerjee et al. | |
| 12,170,248 B2 | 12/2024 | Schuegraf et al. | |
| 2011/0147715 A1 | 6/2011 | Rogers | |
| 2012/0018551 A1* | 1/2012 | Britton | C22C 1/047 977/773 |
| 2012/0321785 A1* | 12/2012 | Rogers | C01B 32/162 427/249.1 |
| 2021/0351413 A1 | 11/2021 | Zhamu et al. | |
| 2022/0109142 A1* | 4/2022 | He | H01M 4/13 |
| 2023/0008834 A1 | 1/2023 | Banerjee et al. | |
| 2023/0105855 A1 | 4/2023 | Banerjee et al. | |
| 2024/0014071 A1 | 1/2024 | Banerjee et al. | |
| 2024/0258118 A1 | 8/2024 | Banerjee et al. | |
| 2024/0295018 A1 | 9/2024 | Banerjee et al. | |
| 2024/0339407 A1 | 10/2024 | Schuegraf et al. | |

OTHER PUBLICATIONS

Agashiwala et al., "Reliability and Performance of CMOS-Compatible Multi-Level Graphene Interconnects Incorporating Vias," 2020 IEEE International Electron Devices Meeting (IEDM), San Francisco, CA, USA, 2020, p. 31.1.1-31.1.4, DOI: 10.1109/IEDM13553.2020.9371986.
Jiang et al., "All-carbon interconnect scheme integrating graphene-wires and carbon-nanotube-vias," 2017 IEEE International Electron Devices Meeting (IEDM), San Francisco, CA, USA, 2017, pp. 14.3.1-14.3.4, DOI: 10.1109/IEDM.2017.8268389.
Jiang et al., "CMOS-Compatible Doped-Multilayer-Graphene Interconnects for Next-Generation VLSI," 2018 IEEE International Electron Devices Meeting (IEDM), San Francisco, CA, USA, 2018, pp. 34.5.1-34.5.4, DOI: 10.1109/IEDM.2018.8614535.
Jiang et al., "Intercalation Doped Multilayer-Graphene-Nanoribbons for Next-Generation Interconnects", Nano Letters, 2017, vol. 17, Issue 3, pp. 1482-1488, DOI: 10.1021/acs.nanolett.6b04516.
Kang et al., "On-chip intercalated-graphene inductors for next-generation radio frequency electronics", Nature Electronics, vol. 1, Jan. 2018, pp. 46-51, DOI: 10.1038/s41928-017-0010-z.
Liu et al., "Characterization of FeCl3 Intercalation Doped CVD Few-Layer Graphene," in IEEE Electron Device Letters, vol. 37, No. 9, pp. 1246-1249, Sep. 2016, DOI: 10.1109/LED.2016.2597099.

U.S. Appl. No. 63/620,748, filed Jan. 12, 2024, titled "Additional Utility of a Graphene Synthesis Tool", 30 pages including drawings.
U.S. Appl. No. 18/674,085, filed May 24, 2024, titled "Low-Temperature/Beol-Compatible Highly Scalable Graphene Synthesis Tools Including Retasked Tools", 40 pages including drawings.
International Search Report and Written Opinion for related PCT Application No. PCT/US2025/010610, mailed on Mar. 7, 2025, 11 pages.
Hemasiri et al. "Fabrication of highly conductive graphene/ITO transparent bi-flm through CVD and organic additives free sol-gel techniques" Scientific Reports; Article [online]. Dec. 19, 2017 [retrieved Feb. 12, 2025].
Jnawali et al. 'Nucleation and initial growth in the semimetallic homoepitaxial system of Bion Bi (111) Physical Review B; Article [online]. May 11, 2009 [retrieved Feb. 13, 2025].
Banerjee, et al., U.S. Appl. No. 63/441,766 titled Large-Area/Wafer-Scale CMOS-Compatible 2D-Material Doping Tools, Processes, and Methods, Including Doping of Synthesized Graphene, filed Jan. 27, 2023, 31 pages.
Schuegraf, U.S. Appl. No. 63/457,362 titled Graphene Beol Integration Techniques, Methods, Structures, and Devices, filed Apr. 5, 2023, 21 pages.
Banerjee, et al., U.S. Appl. No. 63/618,862 titled Techniques, Methods, and Structures for Rapid and Efficient Intercalation-Doping of Large-Area Multi- Layered Graphene Sheets for Transparent Conductor Applications, Including Solar Cells and Displays, filed Jan. 8, 2024, 11 pages.
Banerjee, et al., U.S. Appl. No. 63/218,498 titled Afer-Scale Cmos-Compatible Graphene Synthesis Tool, filed Jul. 6, 2021, 22 pages.
United States Patent and Trademark Office, Non-Final Office Action for U.S. Appl. No. 19/059,193 titled Techniques, Methods, and Structures for Rapid and Efficient Intercalation-Doping of Large-Area Multi-Layered Graphene Sheets for Transparent Conductor Applications, Including Solar Cells and Displays, mailed Mar. 31, 2025, 11 pages.
Banerjee, et al, U.S. Appl. No. 18/655,087, Low-Temperature/Beol•Compatible Highly Scalable Graphene Synthesis Tool, May 3, 2024, 28 pages.
Banerjeem et al., U.S. Appl. No. 63/123,587, CMOS-Compatible Graphene Structures, Interconnects and Fabrication Methods, Dec. 10, 2020, 12pages.
United States Patent and Trademark Office, Notice of Allowance for U.S. Appl. No. 19/059,193, titled Techniques, Methods, and Structures for Rapid and Efficient Intercalation-Doping of Large-Area Multi-Layered Graphene Sheets for Transparent Conductor Applications, Including Solar Cells and Displays, mailed mailed, May 9, 2025, 17 pages.
United States Patent and Trademark Office, Non-Final Office Action for U.S. Appl. No. 19/059,193, titled Techniques, Methods, and Structures for Rapid and Efficient Intercalation-Doping of Large-Area Multi-Layered Graphene Sheets for Transparent Conductor Applications, Including Solar Cells and Displays, mailed Mar. 31, 2025, 12 pages.

* cited by examiner

TECHNIQUES, METHODS, AND STRUCTURES FOR RAPID AND EFFICIENT INTERCALATION-DOPING OF LARGE-AREA MULTI-LAYERED GRAPHENE SHEETS FOR TRANSPARENT CONDUCTOR APPLICATIONS, INCLUDING SOLAR CELLS AND DISPLAYS

CROSS-REFERENCE OF RELATED APPLICATIONS

This application references U.S. patent application Ser. No. 18/674,085, filed on 24 May 2024, and titled LOW-TEMPERATURE/BEOL-COMPATIBLE HIGHLY SCALABLE GRAPHENE SYNTHESIS TOOLS INCLUDING RETASKED TOOLS; U.S. patent application Ser. No. 18/655,087, filed on 3 May 2024, and titled LOW-TEMPERATURE/BEOL-COMPATIBLE HIGHLY SCALABLE GRAPHENE SYNTHESIS TOOL; U.S. patent application Ser. No. 18/607,380, filed on 15 Mar. 2024, and titled GRAPHENE BEOL INTEGATION INTERCONNECTION STRUCTURES; U.S. patent application Ser. No. 18/527,043, filed on 1 Dec. 2023, and titled LARGE-AREA WAFER-SCALE CMOS-COMPATIBLE 2D-MATERIAL INTERCALATION DOPING TOOLS, PROCESSES, AND METHODS, INCLUDING DOPING OF SYNTHESIZED GRAPHENE; U.S. patent application Ser. No. 17/863,232, filed on 12 Jul. 2022, and titled LOW-TEMPERATURE/BEOL-COMPATIBLE HIGHLY SCALABLE GRAPHENE SYNTHESIS TOOL; U.S. patent application Ser. No. 17/857,954, filed on 5 Jul. 2022, and titled LOW-TEMPERATURE/BEOL-COMPATIBLE HIGHLY SCALABLE GRAPHENE SYNTHESIS TOOL; U.S. Provisional Patent Application No. 63/441,766, filed on 27 Jan. 2023, and titled LARGE-AREA/WAFER-SCALE CMOS-COMPATIBLE 2D-MATERIAL DOPING TOOLS, PROCESSES, AND METHODS, INCLUDING DOPING OF SYNTHESIZED GRAPHENE; U.S. Provisional Patent Application No. 63/457,362, filed on 5 Apr. 2023, and titled GRAPHENE BEOL INTEGATION TECHNIQUES, METHODS, STRUCTURES, AND DEVICES; U.S. Provisional Patent Application No. 63/620,748, filed on 12 Jan. 2024, and titled ADDITIONAL UTILITY OF A GRAPHENE SYNTHESIS TOOL; and U.S. Provisional Patent Application No. 63/218,498, filed on 6 Jul. 2021, and titled WAFER-SCALE CMOS-COMPATIBLE GRAPHENE SYNTHESIS TOOL; as related applications, the entire contents of the foregoing applications are hereby incorporated herein by reference.

Furthermore, this application claims priority to U.S. Provisional Patent Application No. 63/618,862, filed on 8 Jan. 2024, and titled TECHNIQUES, METHODS, AND STRUCTURES FOR RAPID AND EFFICIENT INTERCALATION-DOPING OF LARGE-AREA MULTI-LAYERED GRAPHENE SHEETS FOR TRANSPARENT CONDUCTOR APPLICATIONS, INCLUDING SOLAR CELLS AND DISPLAYS; the entire contents of the foregoing application is hereby incorporated herein by reference.

BACKGROUND

In many applications, including mainstream microelectronics (CMOS), often, the conductivity of atomically-thin two-dimensional (2D) layered materials including synthesized multi-layer graphene (MLG), or any multi-layered semiconductor material (such as molybdenum disulphide ($MoS_2$) or tungsten disulphide ($WS_2$)), needs to be modulated. Typically, this involves an increase in the carrier concentration of the electrons or the holes. This increase in the carrier concentration can be achieved through a process known as intercalation doping, which involves the insertion (via diffusion) of certain atoms, ions, or molecules into the host material (in the gap between the adjacent layers, as these are "Van der Waals materials" with no out-of-plane bonds) that induces charge transfer between the dopants (intercalants) and the layered material, for example, MLG.

Depending on the difference in the Fermi-level of the intercalants and the host material, n-type or p-type material with higher electrical conductivity can be engineered. See illustrations in, W. Liu, J. Kang and K. Banerjee, "Characterization of FeCl3 intercalation doped CVD few-layer graphene," IEEE Electron Device Letters, Vol. 37, No. 9, pp. 1246-1249, 2016.

Due to the geometry, for example, such as the layered structure of many 2D materials, intercalation doping may be utilized to minimize the bulk resistivity of the few or multiple stack material. Intercalation doping involves insertion of the dopant atoms/molecules through the sidewall faces of these materials via diffusion, which has been shown to make doping possible for narrow geometries (line-widths) of the 2D materials. Acceleration of such doping processes via application of temperature and/or pressure or via other means can make the doping process production-capable and inexpensive.

Intercalation doping at relatively low temperatures (<450° C.) is needed in a wide range of applications covering microelectronics, optoelectronics, bioelectronics, quantum computing, antennas (5G/6G/terahertz) and many more to satisfy thermal budget requirements.

For example, need for such a low-temperature doping of MLG nanoribbons (MLGNR) arises in several CMOS Back-End-Of-Line (BEOL) applications, particularly on-chip interconnects and inductors. BEOL interconnects must be effectively synthesized and doped under a strict thermal budget of <450° C. to avoid any damage to the underlying active devices (e.g. transistors, diodes, etc. via increased diffusion of impurities).

Transparent conducting films or transparent electrodes (TE) are electrically conductive and optically transparent thin film materials. They are used in a variety of electronic devices, such as liquid crystal displays, OLED displays, photovoltaic, touchscreens, and other flexible/wearable electronic components. The global transparent conductive films market size was valued at $4.9 billion in 2020, and is projected to reach $12.9 billion by 2030 according to market research.

Current TE materials predominantly employ ITO (Indium Tin Oxide), which is expensive and suffer from limited flexibility. Intercalation-doped few-layer/multi-layer graphene (FLG/MLG) based electrodes offer excellent transparency along with low sheet resistance that is difficult to achieve with ITO or other TE materials (see FIG. 6 of W. Liu, J. Kang and K. Banerjee, "Characterization of FeCl3 intercalation doped CVD few-layer graphene," IEEE Electron Device Letters, Vol. 37, No. 9, pp. 1246-1249, 2016).

However, intercalation doping of any relatively large area FLG/MLG sheet is an extremely time consuming process due to the slow diffusion based mechanism of intercalation. Although the intercalation process can be accelerated by applying a diffusion pressure and by increasing the temperature of the intercalation chamber, or via other means of accelerating the diffusion process, it can still take several hours.

This invention involves methods, processes, and structures that significantly reduce the intercalation diffusion time and also increases the efficiency with which large area FLG/MLG sheets can be doped (n-type or p-type) with any intercalant in the form of atoms, ions, or molecules.

Current intercalated sheets and structures of FLG/MLG employ pristine structures (squares, rectangles, circles, etc.) that allow intercalation only via the edges of the structures, while this invention proposes methods, processes, and structures to artificially imprint narrow pathways/openings on the FLG/MLG sheets that can allow a multitude of intercalant diffusion conduits, thereby significantly reducing the intercalation time and increasing the intercalation efficiency.

Applications of the inventive embodiments and concepts presented herein may include; for example, such as TEs which may be employed for use in at least smartphones, tablets, notebooks, PCs, wearable devices displays, solar cells, and flexible electronics and can benefit from the improved intercalation process.

SUMMARY

In one aspect, a transparent or semi-transparent conducting thin film structure or pattern which facilitates the insertion of dopant atoms, ions, or molecules into layered 2D materials, the film structure including: a layered 2D material, an electrically isolative material, where the electrically isolative material is disposed below the layered 2D material, where the layered 2D material has at least one layer, where the layered 2D material is divided into islands of the 2D material, where separation of the islands of 2D material with respect to each other is greater than 0.5 nm and less than 1 meter, and where the islands of 2D material are intercalation doped with at least one dopant, and where the at least one dopant includes intercalation doping agents.

In another aspect, a transparent or semi-transparent conducting thin film structure or pattern which facilitates the insertion of dopant atoms, ions, or molecules into layered 2D materials, the film including: a layered 2D material, an electrically isolative material, where the electrically isolative material is disposed below the layered 2D material, where the layered 2D material is multilayered graphene, where the layered 2D material is divided into islands of the 2D material, where separation of the islands of 2D material with respect to each other is greater than 0.5 nm and less than 1 meter, and where the islands of 2D material are intercalation doped with at least one dopant, and where the at least one dopant includes intercalation doping agents.

And in another aspect, a transparent or semi-transparent conducting thin film structure or pattern which facilitates the insertion of dopant atoms, ions, or molecules into layered 2D materials, the film including: a layered 2D material, an electrically isolative material, where the electrically isolative material is disposed below the layered 2D material, where the layered 2D material is multilayered graphene, where the electrically isolative material is silicon dioxide, where the layered 2D material is divided into islands of the 2D material, where separation of the islands of 2D material with respect to each other is greater than 0.5 nm and less than 1 meter, where the islands of 2D material are intercalation doped with at least one dopant, and where the at least one dopant includes intercalation doping agents.

BRIEF DESCRIPTION OF THE DRAWINGS

The present application can be best understood by reference to the following description taken in conjunction with the accompanying figures, in which like parts may be referred to by like numerals.

Figure 1:
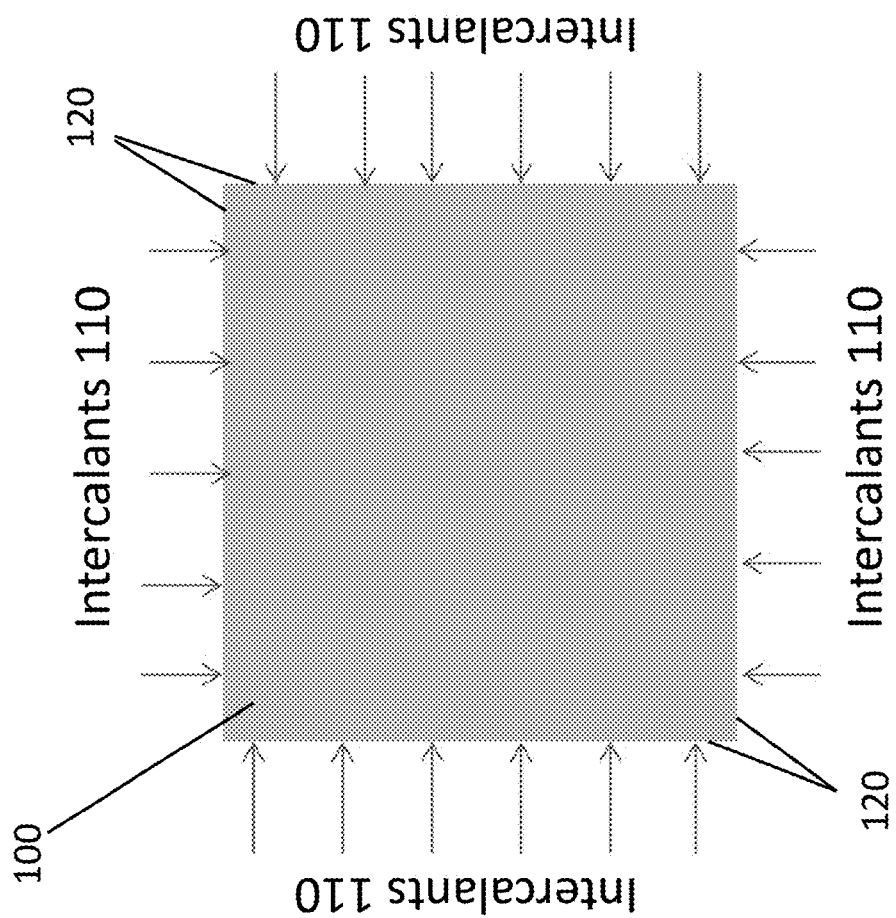
FIG. 1 is an exemplary top view illustration of intercalation doping of a FLG/MLG sheet with diffusion only through the edges, according to some embodiments.

The Figures described above are a representative set and are not exhaustive with respect to embodying the invention or inventions.

DESCRIPTION

Disclosed are a techniques, method, and structures to allow effective intercalation doping of 2D layered materials including FLG/MLG. The following description is presented to enable a person of ordinary skill in the art to make and use the various embodiments. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the various embodiments.

Reference throughout this specification to "one embodiment," "an embodiment," "one example," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art can recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method.

Additionally, the order in which a particular method occurs may or may not strictly adhere to the order of the corresponding steps shown.

Definitions

Back-End-Of-Line (BEOL) is the second portion of IC fabrication where interconnects and other passive circuit elements are formed on the wafer (after the active devices have been fabricated) over the individual devices (primarily the transistors) in multiple layers (i.e., the metallization layers) separated by intra-layer and/or inter-layer insulators.

Complementary metal-oxide-semiconductor (CMOS) is a type of metal-oxide-semiconductor field-effect transistor (MOSFET) fabrication process that uses complementary and often electrically symmetrical pairs of p-type and n-type MOSFETs for implementing logic, memory, and other functions.

Grain boundary (GB) is the interface between two grains and/or crystallites in a polycrystalline material.

Graphene is an allotrope of carbon consisting of a single layer of atoms arranged in a two-dimensional honeycomb lattice.

Graphene nanoribbons (GNRs) are strips of graphene with width less than one-hundred (100) nm.

Multilayer Graphene nanoribbons (MLGNRs) are strips of MLG with a width less than about one-hundred (100) nm.

Graphite is a layered crystalline form of the element carbon with its atoms arranged and covalently bonded forming a hexagonal structure within the layers.

Intercalants are atoms, ions, or molecules utilized to dope a layered material or structure.

Intercalation doping: Intercalation is a process when a molecule or ion inserts reversibly between the layers of a compound (such as potassium ions between graphite layers). N-type intercalation dopants (or n-type intercalants) will transfer electrons to the host material or compound. P-type intercalation dopants (or p-type intercalants) will transfer holes to the host material or compound. Both dopant types will increase the charge carrier density and consequently the electrical conductivity of the material.

Intercalation doping agents: There are many in the literature. Specific to graphene is recent work by Kaustav Banerjee, et al.; for example, J. Jiang, Jae Hwan Chu, and Kaustav Banerjee, "CMOS-Compatible Doped-Multilayer-Graphene Interconnects for Next-Generation VLSI," IEDM 2018, pp. 799-802, 34.5.1-4; J. Jiang, et al., "Intercalation doped multilayer-graphene-nanoribbons for next-generation interconnects," *Nano Letters*, vol. 17, no. 3, pp. 1482-1488, 2017; and J. Kang et al., "On-chip intercalated-graphene inductors for next-generation radio frequency electronics," Nature Electronics, vol. 1, no. 1, pp. 46-51, 2018.

Wafer: is a thin slice of semiconductor (e.g. a crystalline silicon, germanium) used for the fabrication of integrated circuits, etc.

Silicon dioxide is an oxide of silicon and an insulator with the chemical formula $SiO_2$.

Van der Waals materials: materials with strong covalent bonds in the in-plane directions and relatively weak van der Waals bonds in the out-of-plane direction.

DESCRIPTION Continued

This scheme, process, methods, devices, and structures are not limited to only intercalation doping of FLG/MLG, rather, intercalation doping of many other layered materials and structures can be accomplished by the concepts disclosed.

As illustrated in FIG. 1, a conventional intercalation doping process of an FLG/MLG sheet 100 involving intercalant or intercalants 110 diffusion (represented as arrows for clarity and explanation) only through the edges 120 of the FLG/MLG sheet 100 is described. FLG/MLG sheet 100 may include, for example, a few-layer or multi-layer graphene sheet where the distance from edge to edge is so large that effective doping of at least the majority of the sheet volume cannot be obtained in a reasonable amount of time in an intercalation process. Being an edge confined process; intercalation doping can suffer from long processing times as well as not being uniform or efficient. Note that as the thickness (or number of layers) of the MLG increases, there are more pathways along the edges, however, for most TE applications the number of graphene layers is typically <5 due to transparency requirements.

Figure 2:
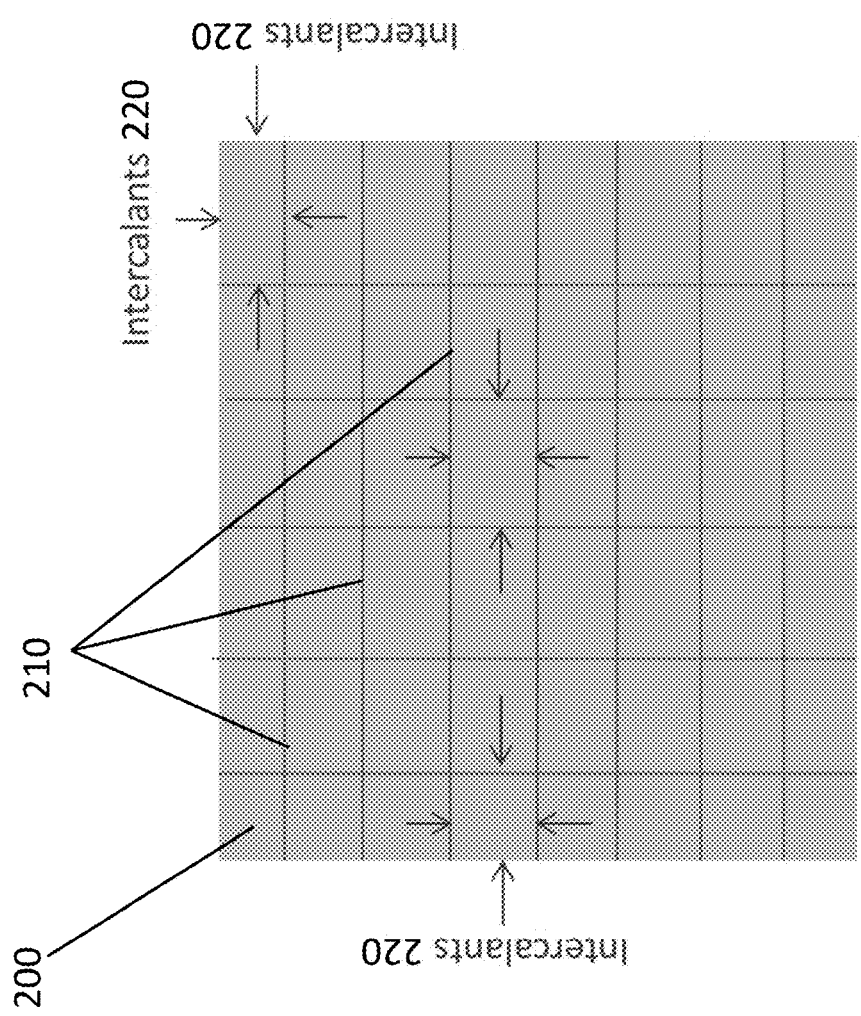
FIG. 2 is an exemplary top view illustration of intercalation doping of an engineered FLG/MLG sheet with an etched narrow grid to allow diffusion through the edges as well as the etched regions, according to some embodiments.

As illustrated in FIG. 2, FLG/MLG sheet 200 may be preprocessed before intercalation doping is processed. An intercalation scheme may include where a grid or grid-like structure including edge openings 210 may be etched on FLG/MLG sheet 200 thereby allowing diffusion of Intercalants 220 through the 'new' edges of FLG/MLG sheet 200—etched regions edge openings 210—as well as the conventional edges of FLG/MLG sheet 200. This 'divide and conquer' scheme results in much faster intercalation coverage per unit area of the sheet, which significantly accelerates the intercalation process, thereby reducing the time to fully intercalate (stage-1 intercalation) the entire sheet and also makes the intercalation doping of a large-area sheet more uniform and efficient. Edge openings 210 may include shapes and design layouts such as the grids and grid-like structures edge openings 210 illustrated in FIG. 2, and may include non-uniform spacing of edge openings 210. In addition, edge openings 210 may have a 'diagonal' orientation, a chevron pattern, semi and/or complete circle shape(s), and so on, depending on design, engineering, and efficiency considerations. If the desire is to provide a complete doping of the area/volume of the target FLG/MLG sheet 200, then care must be taken to ensure that for the given intercalant 220 species and intercalant diffusion acceleration (temperature and/or pressure, or other means of accelerating intercalant diffusion) utilized, that complete doping (to the desired level) is achieved.

The size of the individual grid (or grid density) can be varied, and the width of the grid lines (both vertical and horizontal) can also be varied (from a few nanometers to 10 s, 100 s, or 1000 s of nanometers) depending on the target transparency and sheet resistance values. Since the typical 'van der Waals gap' between adjacent graphene layers in the FLG/MLG is <0.5 nm, even a few nanometer wide etched grid regions can allow intercalation to take place. Moreover, the efficiency of the intercalation doping in the disclosed scheme can outweigh any impact of the grid lines on the effective sheet resistance of the FLG/MLG sheet 200 or resulting full structure, such as the previous discussed TEs. Such narrowly etched lines will also have minimal impact on the optical properties of the FLG/MLG sheet.

The FLG/MLG sheet 200 can be directly synthesized or transferred to a desired substrate before fabricating the grid. The etched regions can be defined using oxygen-plasma and passivated after intercalation to prevent any out-diffusion. This scheme can be employed to effectively create novel engineered transparent conductor materials with tunable properties of transparency and sheet resistance.

See at least patent applications 63/123,587 and PCT/US21/61361 and at least papers J. Jiang, et al., "Intercalation doped multilayer-graphene-nanoribbons for next generation interconnect," *Nano Letters,* 17(3), pp. 1482-1488, 2017.; and J. Jiang, et al., "All-carbon interconnect scheme integrating graphene wires and carbon-nanotube-vias," *IEEE IEDM,* pp. 14.3.1-14.3.4, 2017.; and J. Jiang, et al., "CMOS-Compatible Doped-Multilayer-Graphene Interconnects for Next-Generation VLSI," *IEEE IEDM,* pp. 34.5.1-34.5.4, 2018.; and K. Agashiwala, et al., "Reliability and Performance of CMOS-Compatible Multi-Level Graphene Interconnects Incorporating Vias" *IEEE IEDM,* 2020; and K. Agashiwala, et al., "Demonstration of CMOS-Compatible Multi-Level Graphene Interconnects with Metal Vias" *IEEE Transactions on Electron Devices,* vol. 68, No. 4, April 2021, pp. 2063-2091.; the entirety of all of the forgoing are incorporated by reference.

CONCLUSION

Although the present embodiments have been described with reference to specific example embodiments, various modifications and changes can be made to these embodiments without departing from the broader spirit and scope of the various embodiments. Accordingly, the specification and drawings are to be regarded in an illustrative rather than a restrictive sense.

We claim:

1. A transparent or semi-transparent conducting thin film structure or pattern which facilitates the insertion of dopant atoms, ions, or molecules into layered 2D materials, the film structure comprising:
  a planar sheet of layered 2D material,
  an electrically isolative material,
    wherein said electrically isolative material is disposed below said layered 2D material,
    wherein said layered 2D material has at least one layer disposed in a respective plane,
    wherein said layered 2D material is divided into islands of said 2D material,
    wherein separation of said islands of 2D material with respect to each other is greater than 0.5 nm and less than 1 meter, and
    wherein said islands of 2D material are intercalation doped with at least one dopant, and
    wherein said at least one dopant comprises intercalation doping agents.

2. The film structure according to claim 1,
wherein said intercalation doped means when any number of atoms, molecules or ions insert reversibly between layers of said layered 2D materials.

3. The film structure according to claim 1,
wherein said layered 2D material has a maximum of 100 layers.

4. The film structure according to claim 1,
wherein said layered 2D material is multilayered graphene.

5. The film structure according to claim 1,
wherein said electrically isolative material is silicon dioxide.

6. The film structure according to claim 1,
wherein said separation between islands is equal to or greater than 10 times the diameter of a molecule of said at least one dopant.

7. The film structure according to claim 1,
wherein said islands of 2D material have a maximum width or length of 5 micro-meters.

8. A transparent or semi-transparent conducting thin film structure or pattern which facilitates the insertion of dopant atoms, ions, or molecules into layered 2D materials, the film comprising:
  a planar sheet of layered 2D material, wherein said layered 2D material has at least one layer disposed in a respective plane,
  an electrically isolative material,
    wherein said electrically isolative material is disposed below said layered 2D material,
    wherein said layered 2D material is multilayered graphene,
    wherein said layered 2D material is divided into islands of said 2D material,
    wherein separation of said islands of 2D material with respect to each other is greater than 0.5 nm and less than 1 meter, and
    wherein said islands of 2D material are intercalation doped with at least one dopant, and
    wherein said at least one dopant comprises intercalation doping agents.

9. The film structure according to claim 8,
wherein said intercalation doped means when any number of atoms, molecules or ions insert reversibly between layers of said layered 2D materials.

10. The film structure according to claim 8,
wherein said layered 2D material has a maximum of 100 layers.

11. The film structure according to claim 8,
wherein insertion and diffusion of dopant atoms, ions, or molecules into said layered 2D materials is accelerated by pressure, temperature, or electrical bias, and
wherein a width of said islands is proportional to said acceleration.

12. The film structure according to claim 8,
wherein said electrically isolative material is silicon dioxide.

13. The film structure according to claim 8,
wherein said separation between islands is equal to or greater than 10 times the diameter of a molecule of said at least one dopant.

14. The film structure according to claim 8,
wherein said islands of 2D material have a maximum width or length of 5 micro-meters.

15. A transparent or semi-transparent conducting thin film structure or pattern which facilitates the insertion of dopant atoms, ions, or molecules into layered 2D materials, the film comprising:
  a planar sheet of layered 2D material, wherein said layered 2D material has at least one layer disposed in a respective plane,
  an electrically isolative material,
    wherein said electrically isolative material is disposed below said layered 2D material,
    wherein said layered 2D material is multilayered graphene,
    wherein said electrically isolative material is silicon dioxide,
    wherein said layered 2D material is divided into islands of said 2D material,
    wherein separation of said islands of 2D material with respect to each other is greater than 0.5 nm and less than 1 meter,
    wherein said islands of 2D material are intercalation doped with at least one dopant, and
    wherein said at least one dopant comprises intercalation doping agents.

16. The film structure according to claim 15,
wherein said intercalation doped means when any number of atoms, molecules or ions insert reversibly between layers of said layered 2D materials.

17. The film structure according to claim 15,
wherein said layered 2D material has a maximum of 100 layers.

18. The film structure according to claim 15,
wherein insertion and diffusion of dopant atoms, ions, or molecules into said layered 2D materials is accelerated by pressure, temperature, or electrical bias, and
wherein a width of said islands is proportional to said acceleration.

19. The film structure according to claim 15,
wherein a total edge perimeter of said islands of 2D material is at least 10 times greater than an original perimeter of said 2D layered material with no islands.

20. The film structure according to claim 15,
wherein said islands of 2D material have a maximum width or length of 5 micro-meters.

* * * * *